United States Patent [19]
Nagano et al.

[11] Patent Number: 6,100,729
[45] Date of Patent: Aug. 8, 2000

[54] OUTPUT CIRCUIT, PULSE WIDTH MODULATING CIRCUIT AND SEMICONDUCTOR INTEGRATED CIRCUIT IN WHICH THE LEVEL OF RINGING IS REDUCED

[75] Inventors: Hideo Nagano, Tokyo; Yasufumi Chujo, Osaka, both of Japan

[73] Assignee: Mitsubishi Denki Kabushiki Kaisha, Tokyo, Japan

[21] Appl. No.: 09/215,298

[22] Filed: Dec. 18, 1998

[30] Foreign Application Priority Data

Mar. 25, 1998 [JP] Japan ................... 10-077856

[51] Int. Cl.[7] ........................... H03K 3/00
[52] U.S. Cl. .................. 327/112; 327/310; 327/384; 365/206; 326/27
[58] Field of Search ................ 327/108, 109, 327/111, 112, 309, 306, 310, 313, 318, 379, 384, 387; 365/206, 189.05; 361/111; 326/26, 27

[56] References Cited

U.S. PATENT DOCUMENTS

| | | | |
|---|---|---|---|
| 4,791,521 | 12/1988 | Ouyang et al. | 361/91.3 |
| 5,023,472 | 6/1991 | Hashimoto et al. | 327/108 |
| 5,097,149 | 3/1992 | Lee | 326/87 |
| 5,341,338 | 8/1994 | Hashiguchi et al. | 365/206 |

*Primary Examiner*—Timothy P. Callahan
*Assistant Examiner*—Minh Nguyen
*Attorney, Agent, or Firm*—Leydig, Voit & Mayer, Ltd.

[57] ABSTRACT

An output circuit is constructed such that a load capacitor is not charged by an external power supply but by a first charge storage element within a semiconductor chip that is charged before the load capacitor. The charge stored in the load capacitor is released not directly to the ground but to a second charge storage element within the semiconductor chip and discharged before discharging of the load capacitor.

15 Claims, 13 Drawing Sheets

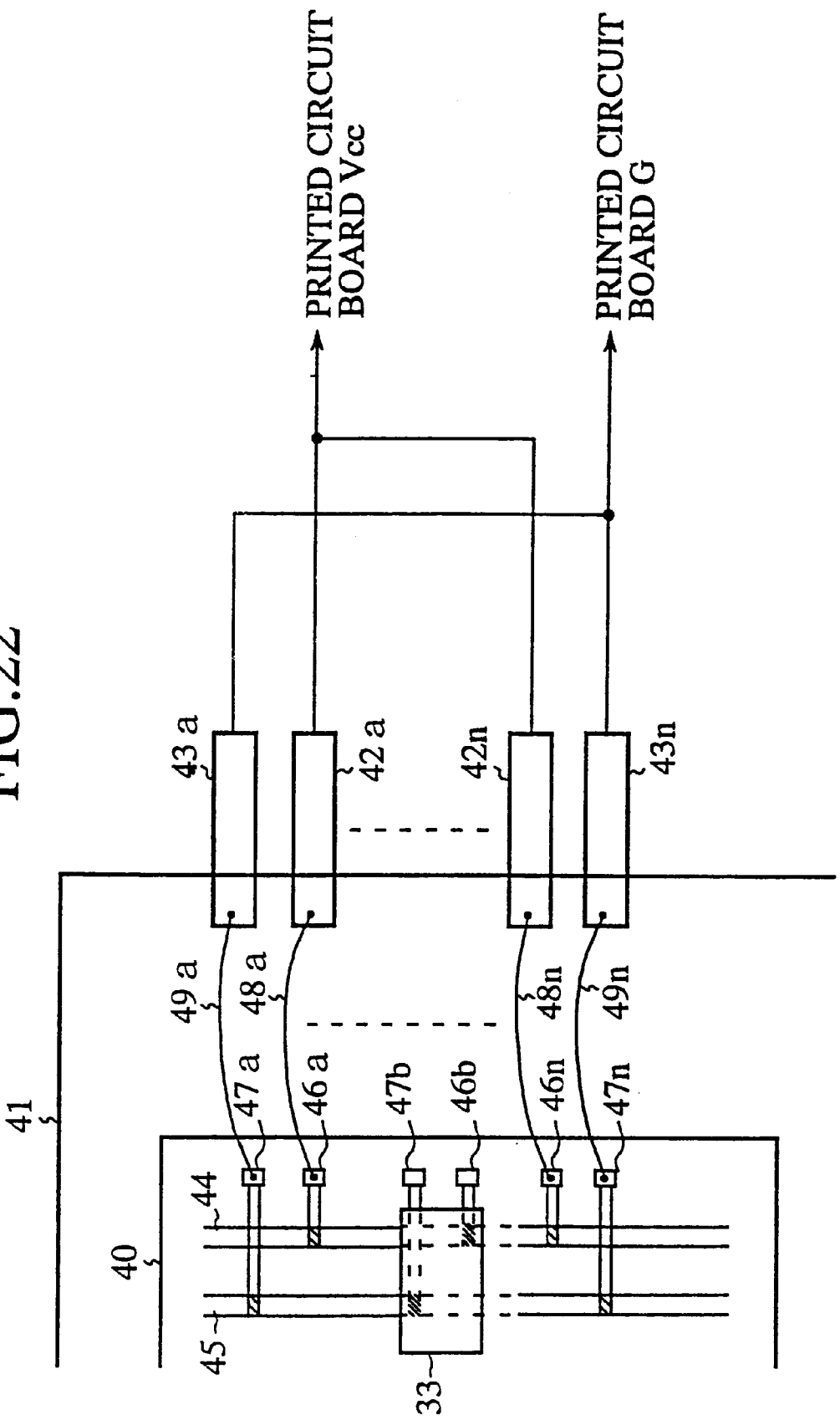

OUTPUT CIRCUIT, PULSE WIDTH MODULATING CIRCUIT AND SEMICONDUCTOR INTEGRATED CIRCUIT IN WHICH THE LEVEL OF RINGING IS REDUCED

BACKGROUND OF THE INVENTION

1. Field of the Invention

The present invention generally relates to output circuits, pulse width modulating circuits and semiconductor integrated circuits and, more particularly, to an output circuit for a pulse width modulation integrated circuit (PWMIC) and a pulse width modulating circuit and a semiconductor integrated circuit in which such an output circuit is used.

2. Description of the Related Art

FIG. 1 is a block diagram of a pulse width modulating circuit in which a prior art output circuit is used. A waveform generating circuit 1 outputs a variety of differently-phased waveforms in accordance with an input clock signal. A waveform selecting circuit 2 selects one of the waveforms from the waveform generating circuit 1 based on, for example, an 8-bit data signal and a 2-bit control signal. An output circuit 3 is supplied with the waveform signal selected by the waveform selecting circuit 2 so as to charge or discharge a load capacitor 4 connected to an output terminal OUT in response to a variation in the polarity of the input signal.

FIG. 2 is a circuit diagram showing the construction of the output circuit 3 comprising a semiconductor chip 5 formed of a PMOS transistor P1 and an NMOS transistor N1, a power supply pad 6 for the semiconductor chip 5, a grounding pad 7 for the semiconductor chip 5, an inductance L1 and a resistance R1 of the lead frame connected between the power supply pad 6 and a power supply terminal Vcc, an inductance L2 and a resistance R2 of the PC board wiring connected between the grounding pad 7 and the ground, an output pad 8 connected to the output terminal OUT, and an inverter circuit 9 connected to an input terminal of the semiconductor chip 5.

A description will now be given of the operation of the prior art output circuit.

As shown in FIG. 3, the waveform generating circuit 1 supplied with the clock signal outputs a variety of differently-phased waveform signals. The waveform selecting circuit 2 selects one of the waveform signals from the waveform generating circuit 1 based on, for example, an 8-bit data signal and a 2-bit control signal, and supplies the selected waveform signal to the output circuit 3.

The semiconductor chip 5 of the output circuit 3 operates such that the PMOS transistor P1 conducts and the NMOS transistor N1 does not conduct when a first polarity of the input waveform signal occurs (for example, in response to a rise of the input wave form signal). Thus, the output circuit 3 charges the load capacitor 4 via the inductance L1, the resistance R1, the power supply pad 6, the PMOS transistor P1 and the output pad 8. When the polarity of the input waveform is inverted, that is, when a second polarity different from the first polarity occurs (for example, responsive to a fall of the input waveform signal), the PMOS transistor P1 does not conduct and the NMOS transistor N1 conducts. Thus, the output circuit 3 discharges the load capacitor 4 via the output pad 8, the NMOS transistor N1, the resistor R2 and the inductance L2.

In this case, the input waveform signal IN is subject to ringing due to the inductance L1 and the inductance L2, producing the waveform OUT as shown in FIG. 4. The resonance frequency f0 of ringing is given by f0=½ πLC, where L indicates the inductance and C indicates the capacitance of the load capacitor.

The level of ringing is given by Q=2 πf0×L/R, where R indicates the on-resistance of the PMOS transistor P1 and the NMOS transistor N1.

When the current driving capability of the PMOS transistor P1 and the NMOS transistor N1 constituting the semiconductor chip 5 in the prior art output circuit is enhanced so as to enable high-speed charging and discharging of the load capacitor 4, the on-resistance of the transistors is decreased so that the level of ringing as shown in FIG. 4 is increased. Such an increase in the level of ringing produces noise in a signal being transmitted, causing a failure in the logic system. It also invites unwanted propagation that is likely to cause a failure in other devices.

The following measures are conceivable to reduce ringing.

(1) Insert a damping resistance in series with the output pad.
(2) Control the input waveform of the output circuit to have a predetermined gradient which reduces a variation per unit period of time in the current level of the input waveform, thus reducing the level of oscillation in the oscillating circuit (through rate control).

The measure (1) is unfavorable in that the resultant output current is attenuated. The measure (2) is also unfavorable in that the output signal is attenuated and high-speed operation is prevented.

It is to be noted that ringing is caused by the inductance of the power source line and the grounding line connected to the pads 6 and 7, respectively, which are connected to the semiconductor chip 5. That is, ringing is unavoidable as long as the charging of the load capacitor 4 takes place via the inductive power source line located outside the semiconductor chip and the discharging thereof takes place via the grounding line also located outside the semiconductor chip.

SUMMARY OF THE INVENTION

Accordingly, an object of the present invention is to provide an output circuit, and a pulse width modulating circuit and a semiconductor integrated circuit using such an output circuit, in which the aforementioned problems are eliminated.

Another and more specific object of the present invention is to provide an output circuit in which the level of ringing is reduced by ensuring that the charging is not performed via the inductive power source line of the semiconductor chip and the discharging is not performed via the inductive grounding line of the semiconductor chip, and to provide a pulse width modulating circuit and a semiconductor integrated circuit in which such an output circuit is used.

In order to achieve the aforementioned objects, the present invention provides an output circuit comprising:

first charging means for storing electric charge for charging a load capacitor at an output terminal of the output circuit;

second charging means for storing electric charge released by the load capacitor being discharged;

a first output transistor for connecting a power supply terminal to the load capacitor when the first output transistor conducts;

a second output transistor for connecting a ground to the load capacitor when the second output transistor conducts;

an output charging control circuit for controlling the first output transistor to conduct or not to conduct based on a first polarity of an input signal, charging the load capacitor via the first charging means when the first output transistor conducts, and charging the first charging means when the first output transistor does not conduct; and an output discharging control circuit for controlling the second output transistor to conduct or not to conduct based on a second polarity different from the first polarity, discharging the load capacitor via the second charge storing means when the second output transistor conducts, and discharging the second charge storing means when the second output transistor does not conduct.

The output circuit may further comprise a charging and discharging circuit for supplying additional charge for charging the load capacitor in addition to charge provided by the first charge storing means, and discharging the load capacitor in cooperation with the second charge storing means.

The output circuit amay further comprise a through current reducing circuit for providing a time difference between switching occurring on a charging path of the charging and discharging circuit and switching occurring on a discharging path of the charging and discharging circuit.

The first charge storing means and the second charge storing means may be implemented by using gate capacitance of an NMOS transistor.

The first charge storing means and the second charge storing means may be implemented by using gate capacitance of a PMOS transistor.

The output circuit may further comprise a delay circuit for providing a delay in an operation of the charging and discharging circuit in response to an inversion of polarity in the input signal, with respect to a corresponding operation of the output charging control circuit and the output discharging control circuit.

The output circuit may further comprise third charge storing means connected between the power supply terminal and the ground so as to be parallel with the charging and discharging circuit.

The aforementioned objects can also be achieved by an output circuit comprising:

first charging means for storing electric charge for charging a load capacitor at an output terminal of the output circuit;

second charging means for storing electric charge released the load capacitor being discharged;

a first output transistor for connecting a power supply terminal to the load capacitor when the first output transistor conducts;

a second output transistor for connecting a ground to the load capacitor when the second output transistor conducts;

an output charging control circuit for controlling the first output transistor to conduct or not to conduct based on a first polarity of an input signal, charging the load capacitor via the first charging means when the first output transistor conducts, and charging the first charging means when the first output transistor does not conduct; and an output discharging control circuit for controlling the second output transistor to conduct or not to conduct based on a second polarity different from the first polarity, discharging the load capacitor via the second charge storing means when the second output transistor conducts, discharging the second charge storing means when the second output transistor does not conduct;

a charging and discharging circuit for supplying additional charge for charging the load capacitor in addition to charge provided by the first charge storing means, and discharging the load capacitor in cooperation with the second charge storing means;

a through current reducing circuit for providing a time difference between switching occurring on a charging path of the charging and discharging circuit and switching occurring on a discharging path of the charging and discharging circuit;

a delay circuit for providing a delay in an operation of the charging and discharging circuit in response to an inversion of polarity in the input signal, with respect to a corresponding operation of the output charging control circuit and the output discharging control circuit; and third charge storing means connected between the power supply terminal and the ground so as to be parallel with the charging and discharging circuit.

The aforementioned objects can also be achieved by a pulse width modulating circuit comprising:

a waveform generating circuit for outputting a variety of differently-phased waveform signals based on an input clock signal;

a waveform selecting circuit for selecting one of the waveform signals output by the waveform generating circuit, based on a data signal and a control signal; and an output circuit provided with the waveform signal selected by the waveform selecting circuit.

The aforementioned objects can also be achieved by a semiconductor integrated circuit comprising:

an output circuit;

a plurality of power supply pads and a plurality of grounding pads provided in the output circuit; and a plurality of leads for connecting the plurality of power supply pods and the plurality or grounding pads to respective external terminals.

BRIEF DESCRIPTION OF THE DRAWINGS

Other objects and further features of the present invention will be apparent from the following detailed description when read in conjunction with the accompanying drawings, in which:

FIG. 22 is a diagram showing the construction of a semiconductor according to an eleventh embodiment of the invention.

DETAILED DESCRIPTION OF THE PREFERRED EMBODIMENTS

First Embodiment

Figure 5:
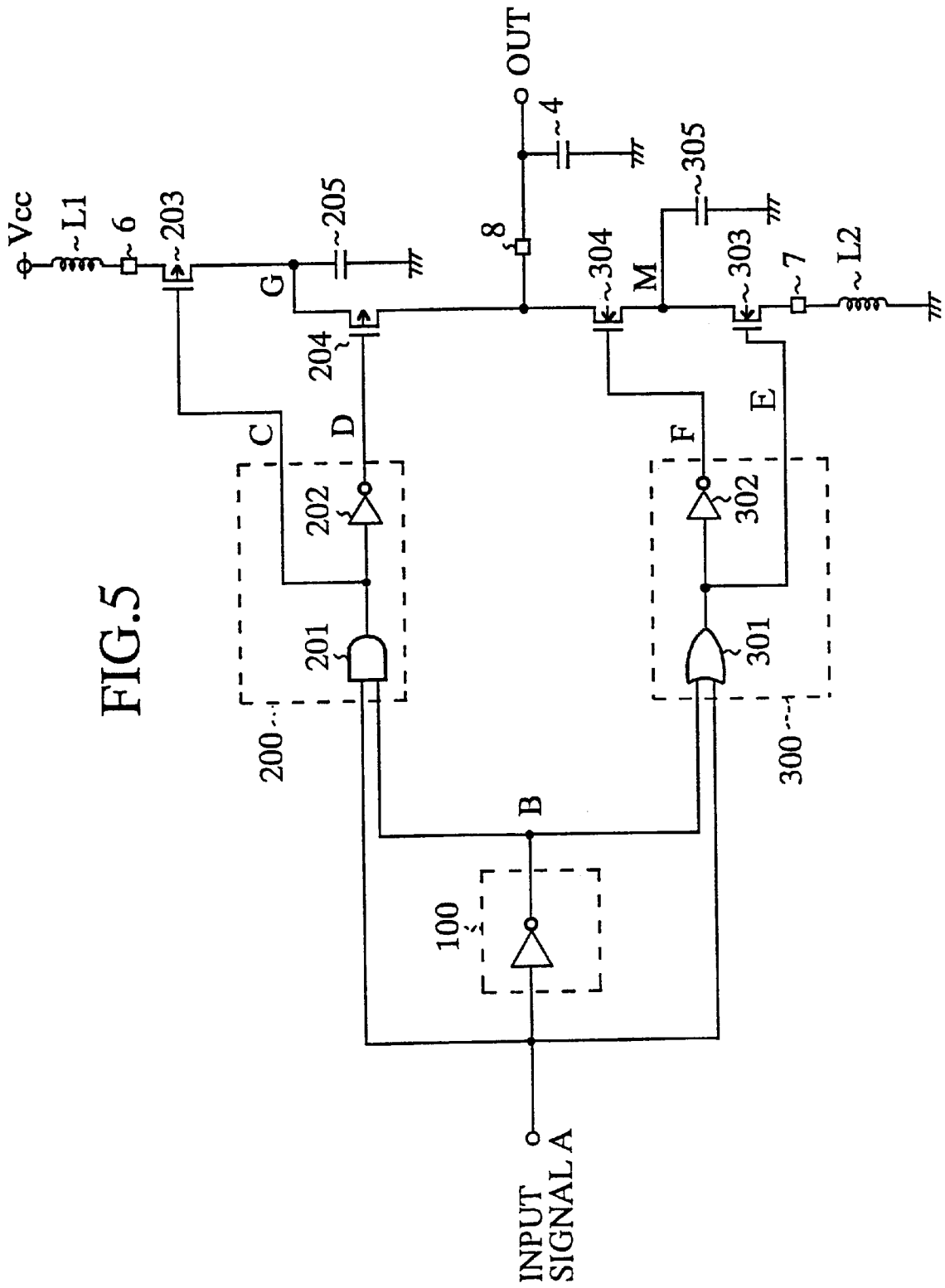
FIG. 5 is a circuit diagram of an output circuit according to a first embodiment of the present invention.

FIG. 5 shows an output circuit according to a first embodiment of the present invention. The output circuit comprises an input signal inverting circuit (inverter) 100, an output charging control circuit 200, a PMOS transistor 203, a PMOS transistor 204 provided as a first output transistor, an output discharging control circuit 300, an NMOS transistor 303, an NMOS transistor 304 provided as a second output transistor, an inductance L1 and an inductance L2.

The output charging control circuit 200 includes an AND circuit 201 supplied with the input signal and an output signal from the input signal inverting circuit 100, and an inverting circuit (inverter) 202 for inverting an output signal from the AND circuit 201. The PMOS transistor 203 has the gate thereof connected to an output terminal of the AND circuit 201, the source thereof connected to the power supply pad 6 and the drain thereof connected to first charge storing means 205. The PMOS transistor 204 has the gate thereof connected to an output terminal of the inverting circuit 202, the source thereof connected to the first charge storing means 205 and the drain thereof connected to the load capacitor 4 at the output terminal OUT via the output pad 8.

The output discharging control circuit 300 comprises an OR circuit 301 supplied with the input signal and an output signal from the input signal inverting circuit 100, and an inverting circuit 302 for inverting an output signal from the OR circuit 301. The NMOS transistor 303 has the gate thereof connected to an output terminal of the OR circuit 301, the source thereof connected to the grounding pad 7 and the drain thereof connected to second charge storing means 305. The NMOS transistor 304 has the gate thereof connected to an output terminal of the inverting circuit 302, the source thereof connected to the second charge storing means 305 and the drain thereof connected to the load capacitor 4 at the output terminal OUT.

The inductance L1 exists in a lead frame connecting the power supply pad 6 and a terminal supplying a power supply voltage Vcc. The inductance L2 exists in a PC board wire connecting the grounding pad 7 and the ground.

Figure 6:
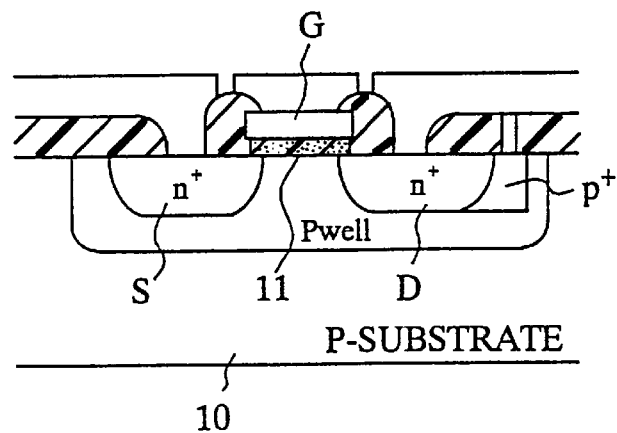
FIG. 6 is a sectional diagram showing the construction of a PMOS transistor operating as charge storing means.

The first charge storing means 205 and the second charge storing means 305 may be implemented by capacitors as shown in FIG. 5. Alternatively, the charge storing means may be implemented by a charge storage capability that exists between the gate G of the PMOS transistor and the substrate. According to the latter construction, a P substrate 10 of the PMOS transistor is provided with an n+ source S and a drain D, as shown in FIG. 6. A gate G is provided between the source S and the drain D above a gate oxide film 11. The gate oxide film 11 has the charge storage capability. Since the charge storage capacity C is given by C=εS/D, a desired charge storage capacity C may be obtained by ensuring that the area S of the gate G is large or by controlling the thickness d of the insulating gate oxide film 11 to be thin.

All of the elements of the output circuit shown in FIG. 5 may be implemented by MOS transistors by using appropriate combinations of MOS transistors to construct the AND circuit 20, the OR circuit 301, the inverting circuits 100, 202 and 302.

A description will now be given of the operation of the output circuit according to the first embodiment.

Figure 7:
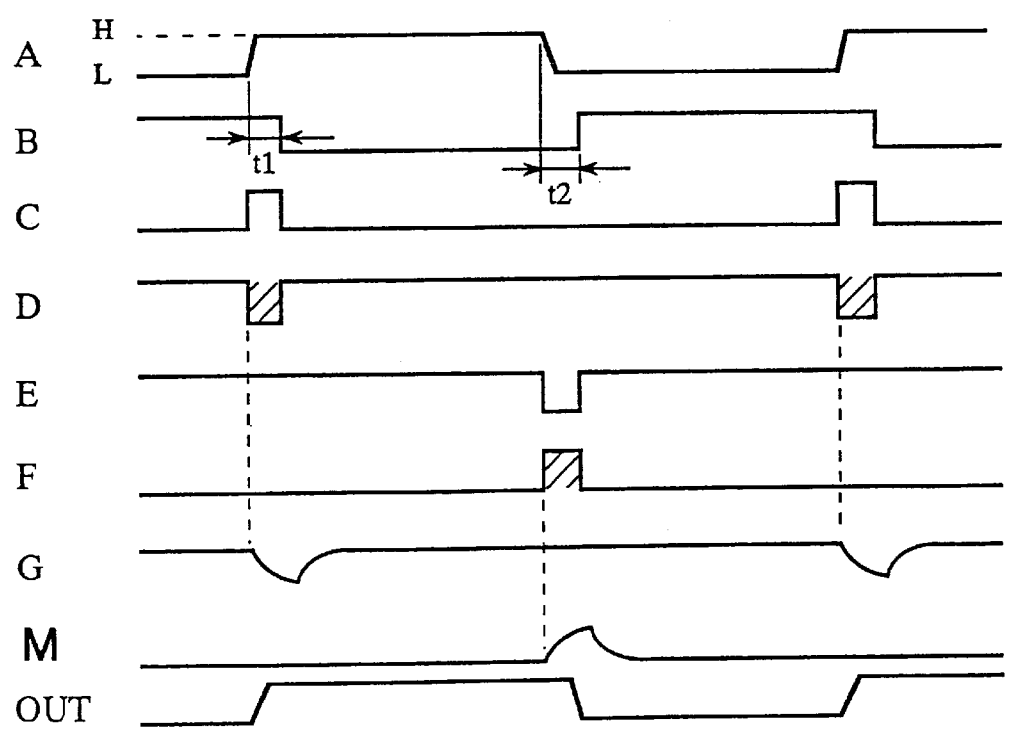
FIG. 7 is a timing chart illustrating the operation of the output circuit according to the first embodiment.

As shown in a timing chart of FIG. 7, when the input signal goes from "L" to "H", an output signal at the output terminal B of the input signal inverting circuit 100 switches from "H" to "L" after a delay time t1 inherent in the input signal inverting circuit 100. As a result, an "H" pulse is output via the output terminal C of the AND circuit 201 during the delay time t1 so as to prevent the PMOS transistor 203 from conducting. The inverting circuit 202 supplied with the "H" pulse outputs an "L" pulse at the output terminal D so as to cause the PMOS transistor 204 to conduct. When the PMOS transistor 204 conducts, the load capacitor 4 is charged by the first charge storing means 205. As a result, the output terminal OUT goes to the "H" level.

When the output signal from the input signal inverting circuit 100 goes "L" after the delay time t1, the output signal from the AND circuit 201 goes "L" so that the output signal from the inverting circuit 201 goes "H". As a result, the PMOS transistor 203 conducts and the PMOS transistor 204 is prevented from conducting. Thus, an external power supply source pre-charges the first charge storing means 205 via the power supply terminal Vcc.

When the input signal goes from "H" to "L", the output signal of the inverting circuit 302 goes from "L" to "H" during the delay time t2 so that the NMOS transistor 304 conducts, the second charge storing means 305 charges the load capacitor 4 and the potential at the output terminal OUT drops to the "L" level. The OR circuit 301 produces an "L" pulse as the output signal so as to cause the NMOS transistor 303 not to conduct and disconnect the second charge storing means 305 from the ground.

When the output signal of the input signal inverting circuit 100 goes "L" after the delay time t2, the output signal of the OR circuit 301 goes "L" so that the output signal of the inverting circuit 302 goes "H". As a result, the NMOS transistor 304 does not conduct and the NMOS transistor 303 conducts. As a result, the charge stored in the second charge storing means 305 is discharged to the ground via the conducting NMOS transistor 303.

As has been described, according to the first embodiment, the load capacitor 4 is not charged by an external power supply. Instead, the first charge storing means 205 provided in the semiconductor chip is pre-charged so as to charge the load capacitor. Moreover, the load capacitor 4 is not discharged to the ground but to the pre-discharged second charge storing means 305 provided in the semiconductor chip. Therefore, ringing is substantially prevented.

Second Embodiment

Figure 8:
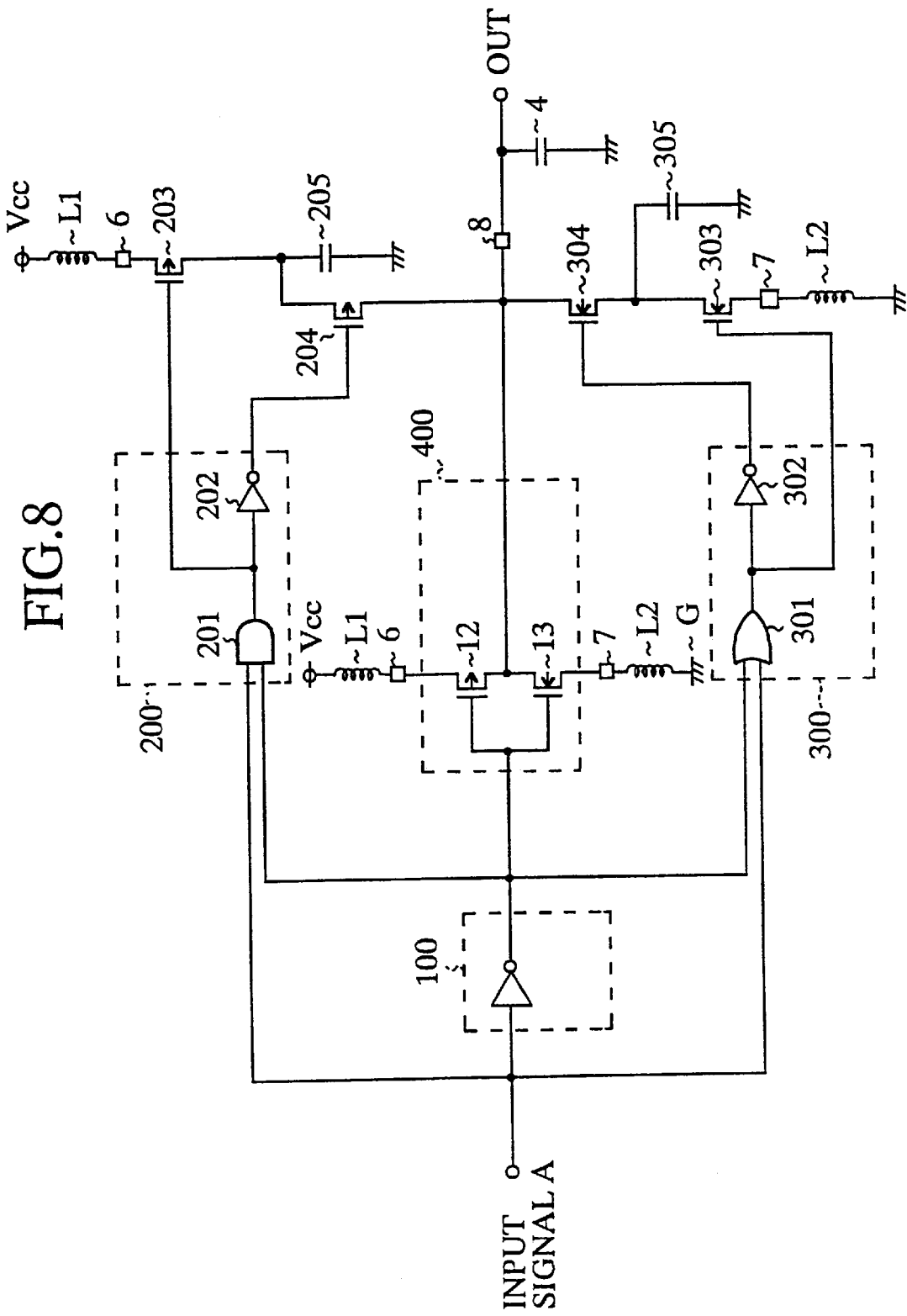
FIG. 8 is a circuit diagram of an output circuit according to a second embodiment of the invention.

FIG. 8 shows an output circuit according to a second embodiment of the present invention. The circuit according to the second embodiment differs from that of the first embodiment in that a charging and discharging circuit 400 is added. The charging and discharging circuit 400 is composed of a PMOS transistor 12 and an NMOS transistor 13. The PMOS transistor 12 has the gate G thereof connected to the output terminal of the input signal inverting circuit 100 and the source S thereof connected to the power supply terminal Vcc via the power supply pad 6, and the drain D thereof connected to the output terminal OUT via the output pad 8. The NMOS transistor 13 has the gate G thereof connected to the output terminal of the input signal inverting circuit 100, the source S thereof connected to the ground G via the grounding pad 7 and the drain D thereof connected to the output terminal OUT via the output pad 8.

The current driving capability P2 of the PMOS transistor 12 and the NMOS transistor 13, and the current driving capability P1 of the PMOS transistor 204 and the NMOS transistor 304 are controlled such that P1>P2. The ratio between P1 and P2 may be determined by considering a tradeoff between the ringing level due to the PMOS transistor 12 and the NMOS transistor 13, and the time required for the voltage level at the output terminal OUT to rise to the power supply voltage Vcc level.

A description will now be given of the operation.

When the input signal goes from "L" to "H" as shown in the timing chart of FIG. 7, the output signal at the output terminal B of the input signal inverting circuit 100 goes from "H" to "L" after the delay time t1 inherent in the input signal inverting circuit 100. As a result, the AND circuit 201 outputs via the output terminal C thereof the "H" pulse during the delay time t1 so as to cause the PMOS transistor 203 not to conduct. The inverting circuit 202 supplied with the "H" pulse outputs the "L" pulse to the output terminal D so as to cause the PMOS transistor 204 to conduct. When the PMOS transistor 204 conducts, the first charge storing means 205 charges the load capacitor 4. As a result, the voltage level at the output terminal OUT rises to the "H" level.

When the output signal of the input signal inverting circuit 100 goes "L" after the delay time t1, the output signal of the AND circuit 201 goes "L" and the output signal of the inverting circuit 202 goes "H". As a result, the PMOS transistor 203 conducts and the PMOS transistor 204 does not conduct. Thus, an external power supply pre-charges the first charge storing means 205 via the power supply terminal Vcc.

Figure 9:
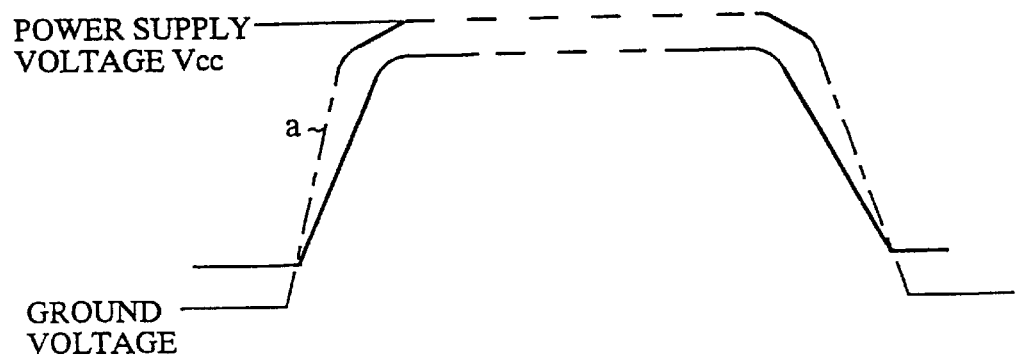
FIG. 9 is a waveform chart showing how a load capacitor is charged and discharged.

Since the electric charge flowing to the load capacitor 4 is supplied by the first charge storing means 205, the level at the output terminal OUT can not be raised to the level of the power supply voltage. The remainder of the required charge is supplied by the charging and discharging circuit 400. The PMOS transistor 12 constituting a charging path of the charging and discharging circuit 400 conducts at the same period of time as the PMOS transistor 204 so that the current flowing in the PMOS transistor 12 charges the load capacitor 4. As a result, the output terminal OUT is raised to the level of the power supply voltage Vcc, as indicated by the broken line in FIG. 9.

While the input signal is at the "H" level, the NMOS transistor 303 conducts by being supplied with the output signal from the OR circuit 301. The charge stored in the second charge storing means 305 is released to the ground so that the second charge storing means 305 is discharged.

When the input signal goes from "H" to "L", the output of the inverting circuit 302 goes from "L" to "H" during the delay time t2 provided by the input signal inverting circuit 100 so as to cause the NMOS transistor 304 to conduct. The OR circuit 301 outputs the "L" pulse so as to cause the NMOS transistor 303 not to conduct, thus disconnecting the output circuit from the ground. As a result, the second charge storing means 305 is charged by the charge from the load capacitor 4 via the conducting NMOS transistor 304 so that the potential at the output terminal OUT drops.

Since the load capacitor 4 is discharged to the second charge storing means 305, the level at the output terminal OUT does not drop to the ground level. Accordingly, the residual charge is released through the charging and discharging circuit 400. The NMOS transistor 13 constituting a discharging path of the charging and discharging circuit 400 conducts at the same time as the NMOS transistor 304 so that the load capacitor 4 is discharged via the NMOS transistor 13. As a result, the level at the output terminal OUT drops to the ground potential as indicated by the alternate long and short dashed line in FIG. 9.

As has been described, according to the second embodiment, the load capacitor 4 is not charged by an external power supply. Instead, the first charge storing means 205 provided in the semiconductor chip is pre-charged so as to charge the load capacitor 4. Moreover, the load capacitor 4 is not discharged to the ground but to the pre-discharged second charge storing means 305 provided in the semiconductor chip. Therefore, ringing is substantially prevented. The second embodiment ensures that the level at the output terminal OUT rises to the power supply voltage Vcc and completely drops to the ground potential level.

Third Embodiment

Figure 10:
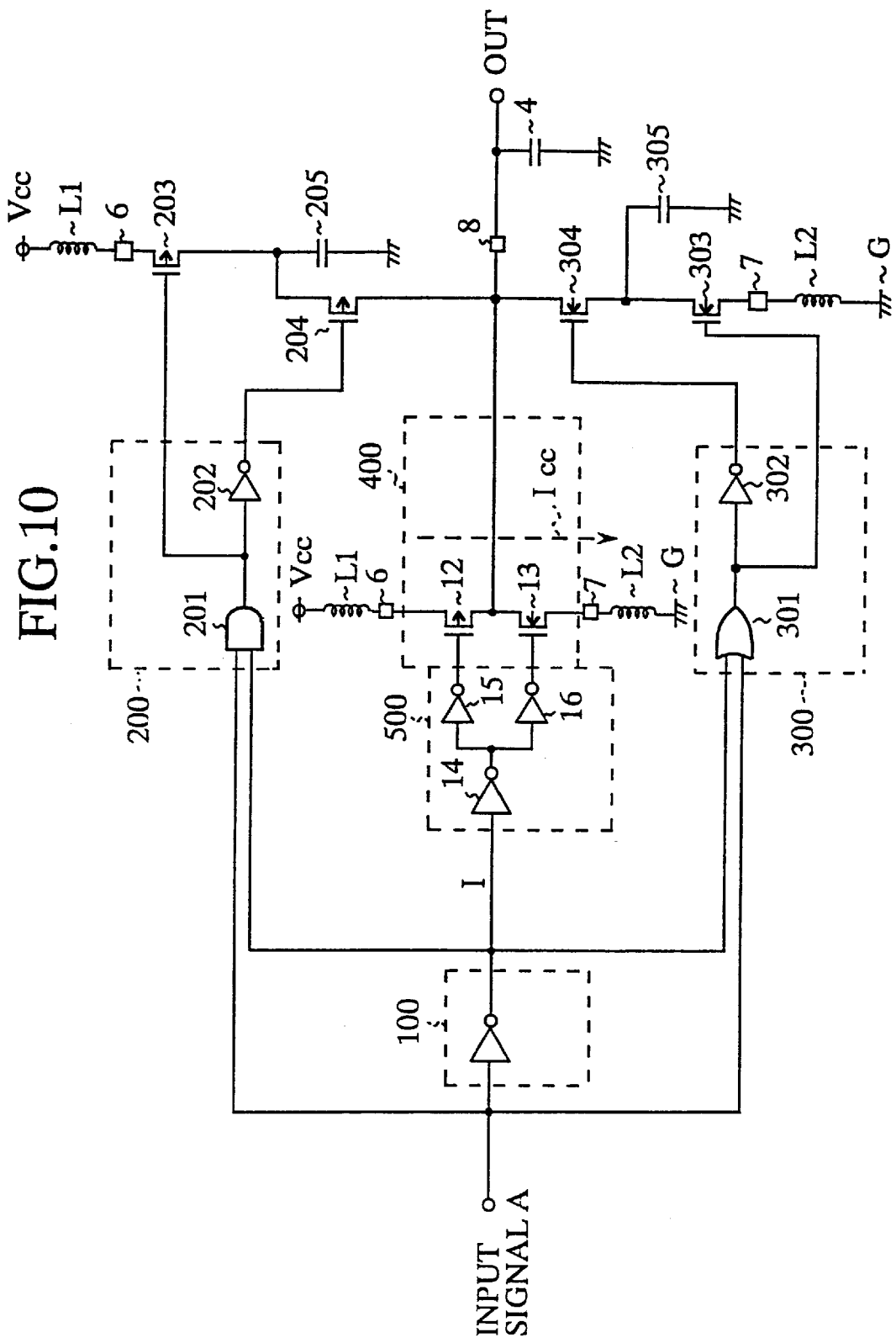
FIG. 10 is a circuit diagram of an output circuit according to a third embodiment of the invention.

FIG. 10 shows the output circuit according to a third embodiment of the present invention. The circuit according to the third embodiment differs from that of the second embodiment shown in FIG. 8 in that a through-current reducing circuit (waveform shaping circuit) 500 is added. The through-current circuit 500 is composed of inverting circuits 14–16. The inverting circuit 14 is connected to the output terminal of the input signal inverting circuit 100. The inverting circuit 15 is connected between the output terminal of the inverting circuit 14 and the gate G of the PMOS transistor 12 constituting the discharging path of the charging and discharging circuit 400. The inverting circuit 16 is connected between the output terminal of the inverting circuit 14 and the gate G of the NMOS transistor 13 constituting the discharging path of the charging and discharging circuit 400.

Figure 11:
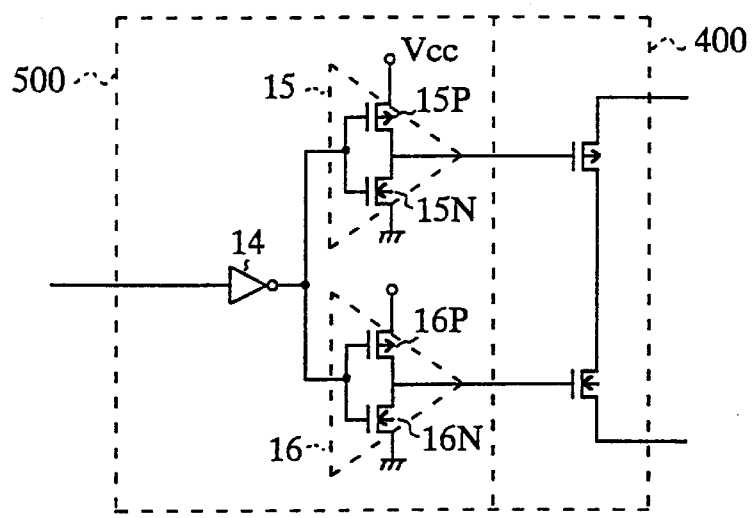
FIG. 11 is a circuit diagram showing a relation between a charging and discharging circuit and a through current reducing circuit.

As shown in FIG. 11, the inverting circuit 15 comprises a PMOS transistor 15P and an NMOS transistor 15N, and the inverting circuit 16 comprises a PMOS transistor 16P and an NMOS transistor 16N. The current driving capability of the PMOS transistor 15P is greater than that of the NMOS transistor 15N, and the current driving capability of the PMOS transistor 16P is less than that of the NMOS transistor 16N.

A description will now be given of the operation of the output circuit according to the third embodiment.

Figure 12:
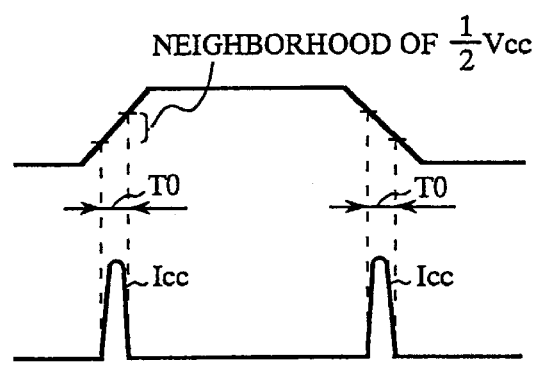
FIG. 12 is a waveform chart illustrating how a through current flows in the charging and discharging circuit.

The charging and discharging operation with respect to the load capacitor 4 at the output terminal OUT according to the third embodiment is the same as that of the second embodiment so that the description thereof is omitted. As the PMOS transistor 12 and the NMOS transistor 13 constituting the charging and discharging circuit 400 change from a conducting state to a non-conducting state or from a non-conducting state to a conducting state in the process of charging or discharging, both the PMOS transistor 12 and the NMOS transistor 14 may be turned on during the time t0, as shown in FIG. 12. In this state, a through current Icc flows from the terminal supplying the power supply voltage Vcc to the ground G via the transistors, increasing the level of ringing.

According to the third embodiment, a through current reduction circuit 500 is provided at the input terminal of the charging and discharging circuit 400. The output signals of the inverting circuits 15 and 16 constituting the through current reduction circuit 500 prevents the PMOS transistor 12 and the NMOS transistor 13 from being turned on concurrently. In this way, the through current Icc is prevented from flowing.

Figure 13:
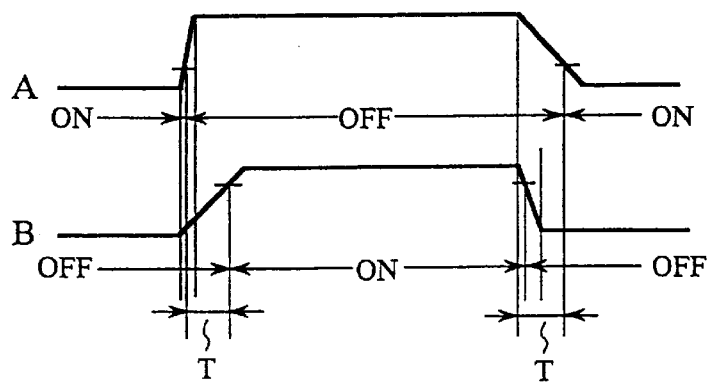
FIG. 13 is a waveform chart illustrating the operation of the charging and discharging circuit of FIG. 11.

More specifically, the inverting circuit 15 is constructed such that the current driving capability of the PMOS transistor 15P is greater than that of the NMOS transistor 15N, and the inverting circuit 16 is constructed such that the current driving capability of the PMOS transistor 16P is less than that of the NMOS transistor 16N. Therefore, as shown in FIG. 13, at the rising edge of the signal, the output signal of the inverting circuit 15 causes the PMOS transistor 12 to respond relatively promptly. Conversely, the output signal of the inverting circuit 16 causes the NMOS transistor 13 to respond slowly. At the falling edge of the signal, the NMOS transistor 13 is caused to respond relatively promptly, and the PMOS transistor 12 is caused to respond relatively slowly.

As a result, the PMOS transistor 12 operates as shown in A of FIG. 13, and the NMOS transistor 13 operates as shown in B of FIG. 13. Thus, at the rising edge of the signal, the NMOS transistor 13 turns on later than the PMOS transistor 12 turns off. At the falling edge of the signal, the NMOS transistor 13 turns off earlier than the PMOS transistor 12 turns on. A period of time T is created in which the transistors are not turned on concurrently. For this reason, the through current Icc does not flow.

Thus, according to the third embodiment, the through current Icc is prevented from flowing as a result of both the PMOS transistor 12 and the NMOS transistor 13 constituting the charging and discharging circuit 400 being turned on.

Fourth Embodiment

Figure 14:
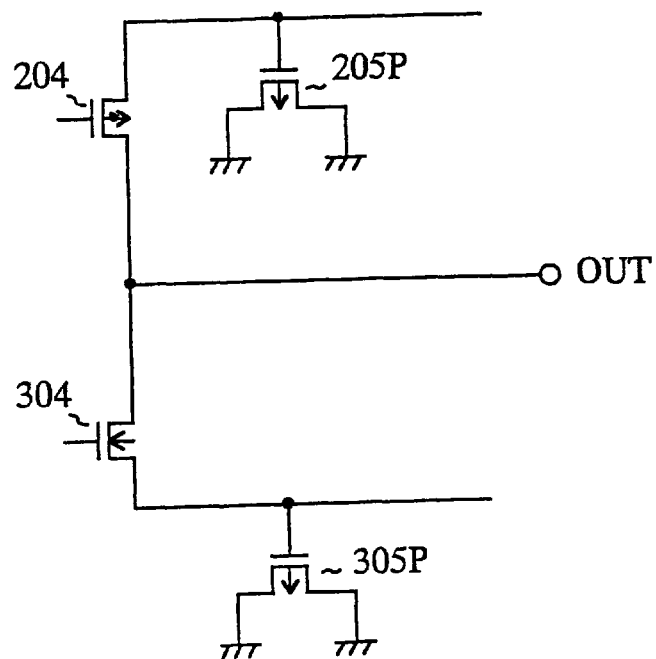
FIG. 14 is a circuit diagram of an output circuit according to a fourth embodiment of the invention in which charge storing means is embodied by a PMOS transistor.

FIG. 14 shows a part of the output circuit according to a fourth embodiment of the present invention, wherein the first charge storing means 205 is embodied by a PMOS transistor 205P and the second charge storing means 305 is embodied by a PMOS transistor 305P.

Thus, according to the fourth embodiment, the charge storing means is embodied by PMOS transistors, permitting large-scale integration in a semiconductor chip.

Fifth Embodiment

Figure 15:
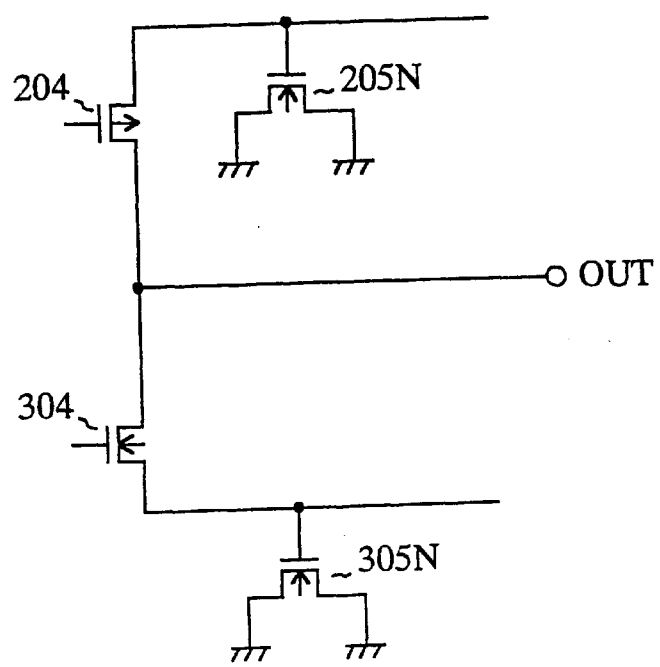
FIG. 15 is a circuit diagram of an output circuit according to a fifth embodiment of the invention in which charge storing means is embodied by an NMOS transistor.

FIG. 15 shows a part of the output circuit according to a fifth embodiment of the present invention, wherein the first charge storing means 205 is embodied by an NMOS transistor 205N and the second charge storing means 305 is embodied by an NMOS transistor 305N.

Thus, according to the fifth embodiment, the charge storing means is embodied by NMOS transistors, permitting large-scale integration in a semiconductor chip.

Sixth Embodiment

Figure 16:
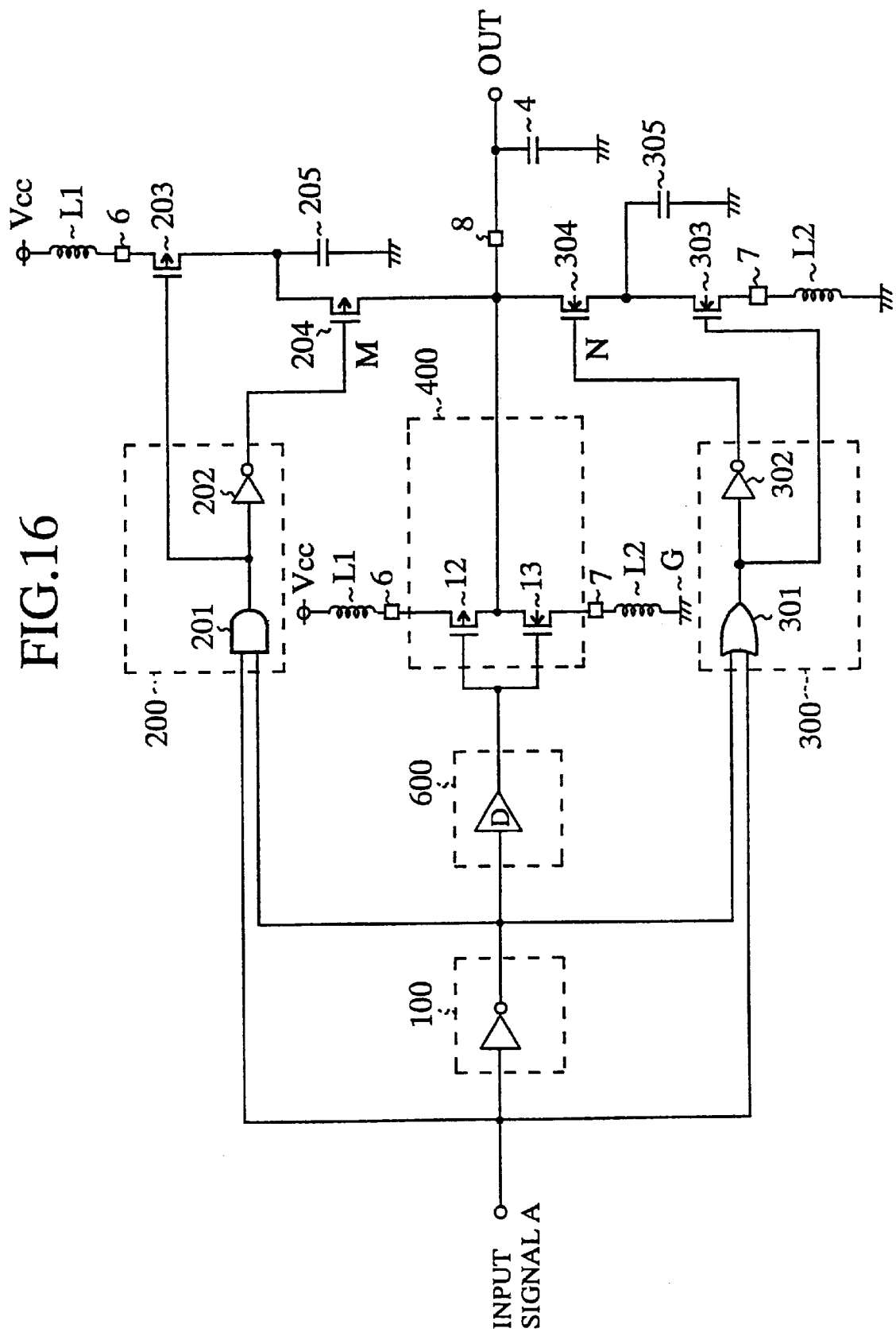
FIG. 16 is a circuit diagram of an output circuit according to a sixth embodiment of the invention.

FIG. 16 is a circuit diagram showing the output circuit according to a sixth embodiment of the present invention. The circuit according to the sixth embodiment differs from that of the second embodiment in that a delay circuit 600 is provided between the output terminal of the input signal inverting circuit 100 and the charging and discharging circuit 400.

In this construction, the delay circuit 600 responds to the switching of the input signal from "H" to "L" or from "L" to "H" by providing a time between the charging of the load capacitor 4 via the PMOS transistor 204 and the charging of the load capacitor 4 via the charging and discharging circuit 400 and also between the discharging of the load capacitor 4 via the NMOS transistor 304 and the discharging via the charging and discharging circuit 400.

More specifically, after the PMOS transistor 204 conducts in response to an associated variation in the input signal so as to charge the load capacitor 4, the PMOS transistor 12 constituting the charging path of the charging and discharging circuit 400 conducts so as to charge the load capacitor 4. Likewise, after the NMOS transistor 304 conducts in response to an associated variation in the input signal so as to discharge the load capacitor 4, the NMOS transistor 13 constituting the discharging path of the charging and discharging circuit 400 conducts so as to discharge the load capacitor 4.

Figure 17:
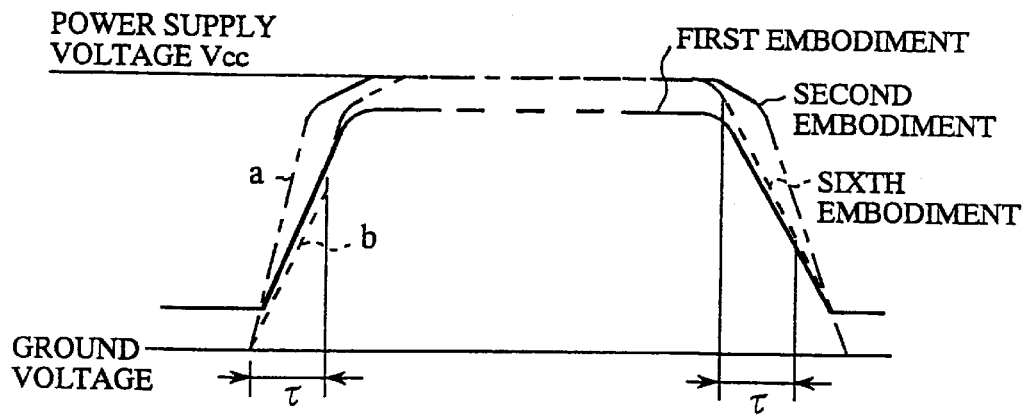
FIG. 17 is a timing chart illustrating the operation of the output circuit according to the sixth embodiment.

According to the sixth embodiment, the PMOS transistor 12 constituting the charging path of the charging and discharging circuit 400 is prevented from charging, in response to an associated variation in the input signal, the load capacitor before the load capacitor 4 is charged via the built-in first charge storing means 205. Likewise, the NMOS transistor 13 constituting the discharging path of the charging and discharging circuit 400 is prevented from discharging the load capacitor 4 before the load capacitor 4 is discharged via the built-in second charge storing means 305. The PMOS transistor 12 constituting the charging path of the charging and discharging circuit 400 conducts in response to an output from the delay circuit 600 so as to subsequently charge the load capacitor 4, a delay time of τ being provided by the delay circuit 600 with respect to the variation in the input signal. Likewise, the NMOS transistor 13 constituting the discharging path of the charging and discharging circuit 400 conducts in response to an output from the delay circuit 600 so as to subsequently discharge the load capacitor 4, a delay time of τ being provided by the delay circuit 600 with respect to the variation in the input signal. Thus, charging and discharging of the load capacitor 4 according to the sixth embodiment occurs as indicated by the dotted line b of FIG. 17. As a result, the load capacitor 4 is prevented from being charged via the inductive power supply line or discharged via the inductive grounding line in response to a variation in the potential of the input signal.

Seventh Embodiment

Figure 18:
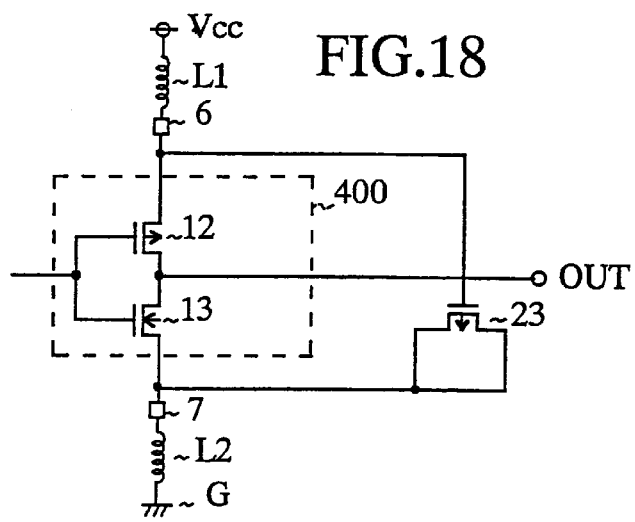
FIG. 18 is a circuit diagram of an output circuit according to a seventh embodiment in which charge storing means embodied by a PMOS transistor is connected in parallel with the charging and discharging circuit.

FIG. 18 shows a part of the output circuit according to a seventh embodiment of the present invention. A PMOS transistor 23 is provided as charge storing means, connected in parallel with the charging and discharging circuit 400, according to the second embodiment, which is connected between the power supply terminal Vcc and the ground G.

In this construction, the PMOS transistor 23 serves as a bypass capacitor that reduces noise generated when the PMOS transistor 12 or the NMOS transistor 13 constituting the charging and discharging circuit 400 switches from "H" to "L" or from "L" to "H".

Thus, since the PMOS transistor 23 is provided inside the semiconductor chip, the seventh embodiment is effective in reducing noise due to the inductance of semiconductor lead frames or wires inside a resin in which the lead frame is the molded.

Eighth Embodiment

Figure 19:
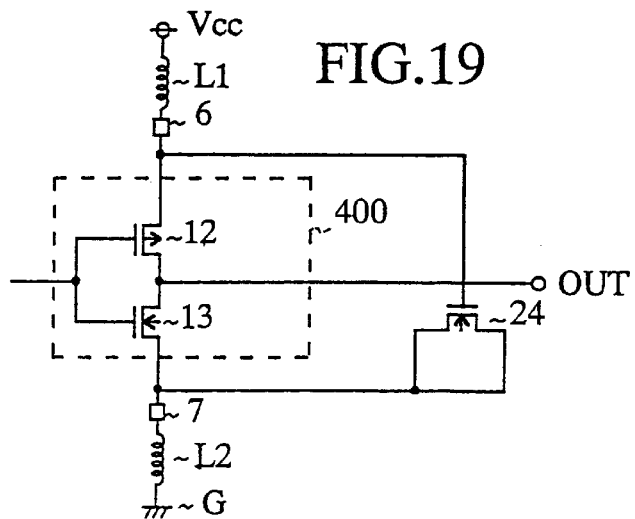
FIG. 19 is a circuit diagram of an output circuit according to an eighth embodiment in which charge storing means embodied by an NMOS transistor is connected in parallel with the charging and discharging circuit.

FIG. 19 shows a part of the output circuit according to an eighth embodiment of the present invention. An NMOS transistor 24 is provided as charge storing means, connected in parallel with the charging and discharging circuit 400, according to the second embodiment, which is connected between the power supply terminal Vcc and the ground G.

The construction and the effect of the eighth embodiment are the same as those of the seventh embodiment and the description thereof is omitted.

Ninth Embodiment

Figure 20:
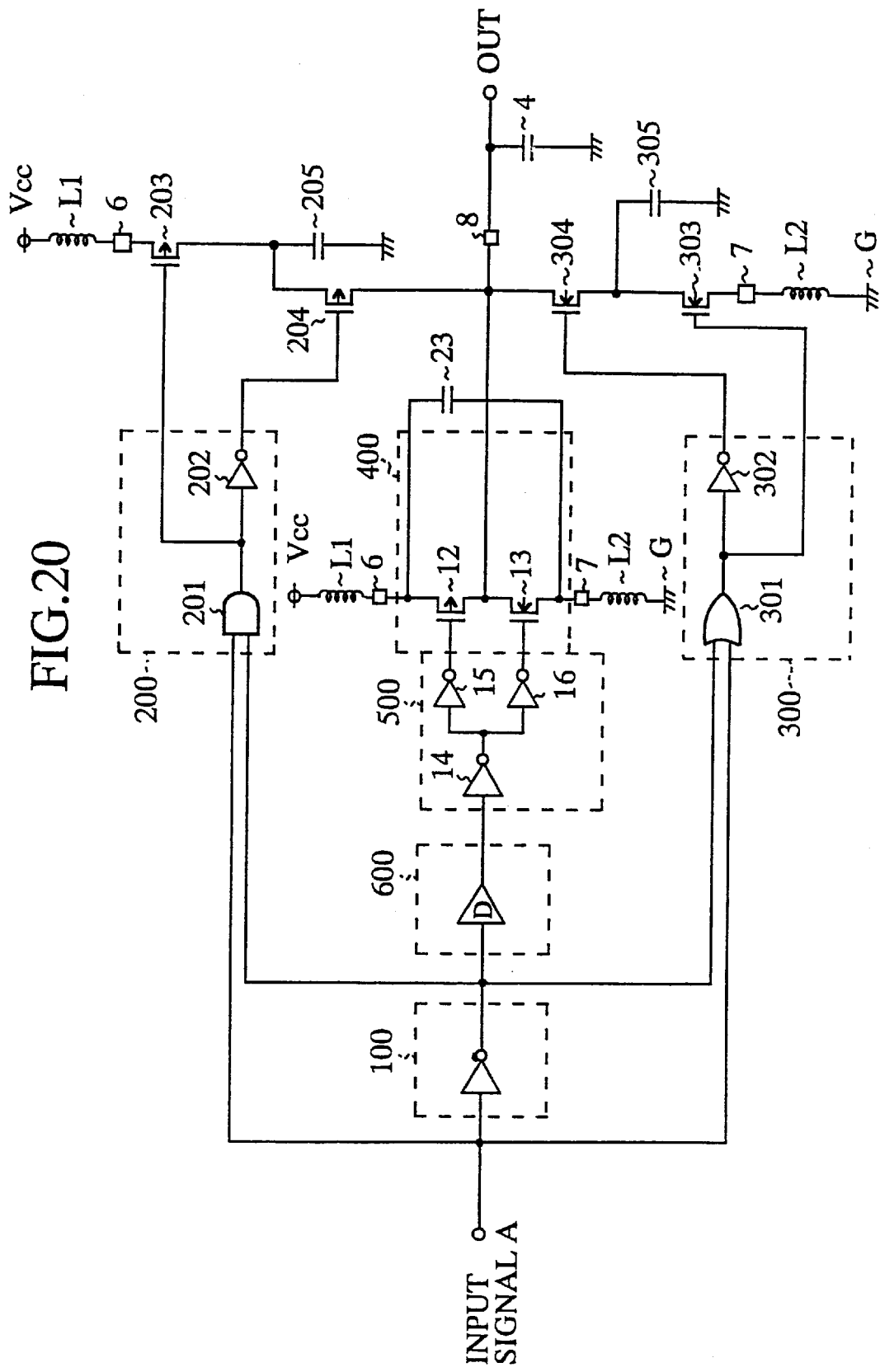
FIG. 20 is a circuit diagram of an output circuit according to a ninth embodiment of the present invention.

FIG. 20 is a circuit diagram showing the output circuit according to a ninth embodiment of the present invention. The circuit according to the ninth embodiment is based on the output circuit according to the first embodiment to which are added the charging and discharging circuit 400 according to the second embodiment, the through current reducing circuit 500 according to the third embodiment, the delay circuit 600 according to the sixth embodiment, and the PMOS transistor 23 (the charge storing means) according to the seventh embodiment or the NMOS transistor 24 (the charge storing means) according to the eighth embodiment. The description of the circuit according to the ninth embodiment is omitted since the description of each embodiment has already been given.

According to the ninth embodiment, the built-in first charge storing means 205 charges the load capacitor 4 so that noise occurring due to the internal inductance of the semiconductor lead frame or the wires is reduced. The charging and discharging circuit 400 properly switches the charging level of the load capacitor 4 from the power supply voltage level to the ground level and vice versa. In this process, the charge collected in the load capacitor 4 is released to the second charge storing means 305 earlier than to the charging and discharging circuit 400.

The delay circuit 600 responds to the switching of the PMOS transistor 12 and the NMOS transistor 13 constituting the charging and discharging circuit 400 from "H" to "L" (from "L" to "H") by preventing the transistors from being turned on concurrently. In this way, the through current Icc is prevented so that the level of ringing is reduced.

The PMOS transistor 23 or the NMOS transistor 24 provided as the charge storing means reduces noise that occurs when the PMOS transistor 12 or the NMOS transistor 13 constituting the charging and discharging circuit 400 switches from "H" to "L" or from "L" to "H".

Tenth Embodiment

Figure 21:
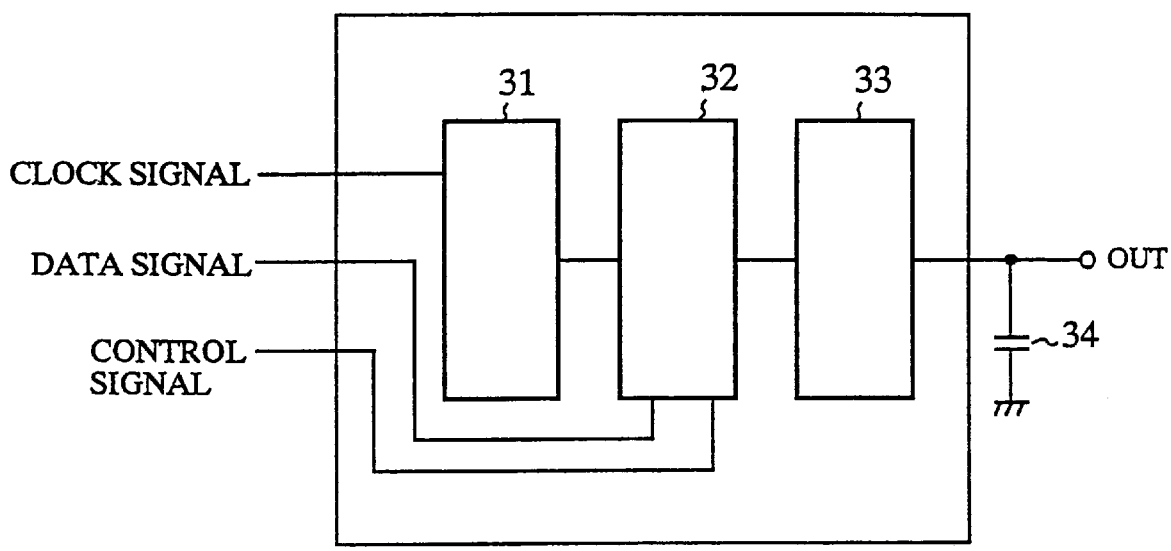
FIG. 21 is a block diagram of a pulse width modulating circuit according to a tenth embodiment of the invention.

FIG. 21 is a block diagram of a pulse width modulating circuit according to an eleventh embodiment of the present invention. A waveform generating circuit 31 outputs a variety of differently-phased waveforms in accordance with input clock signals. A waveform selecting circuit 32 selects one of the waveforms from the waveform generating circuit 31 based on, for example, a data signal and a control signal. An output circuit 33 is supplied with the waveform signal selected by the waveform selecting circuit 32 so as to charge or discharge a load capacitor 34 in response to a variation in the polarity of the input signal. The output circuit 33 is embodied by the circuit according to one of the first through ninth embodiments described above.

A description will now be given of the operation of the pulse width modulating circuit.

Figure 1:
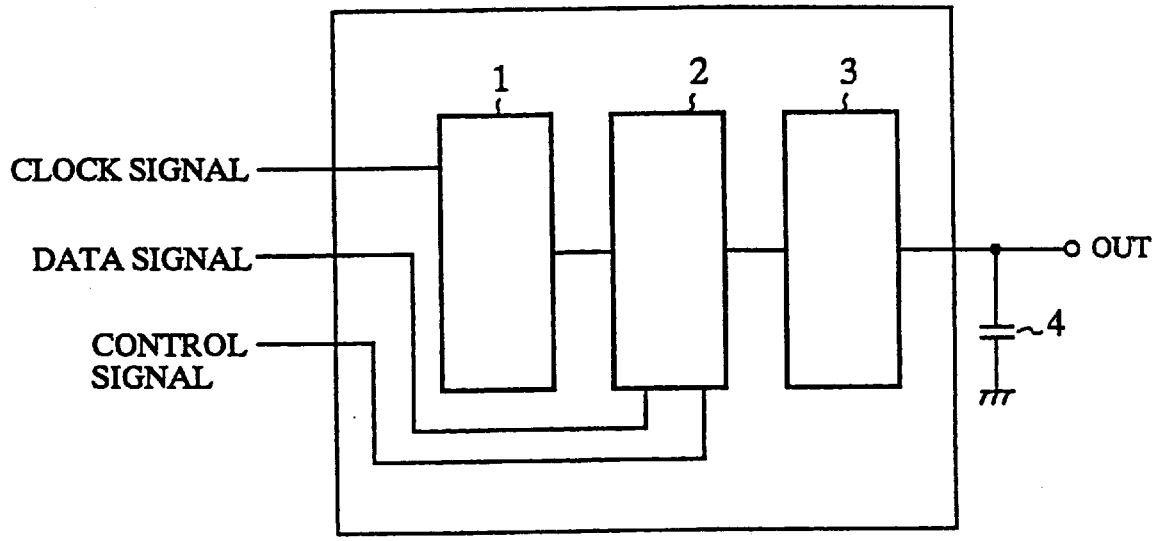
FIG. 1 is a block diagram of a pulse width modulating circuit according to the related art.
Figure 2:
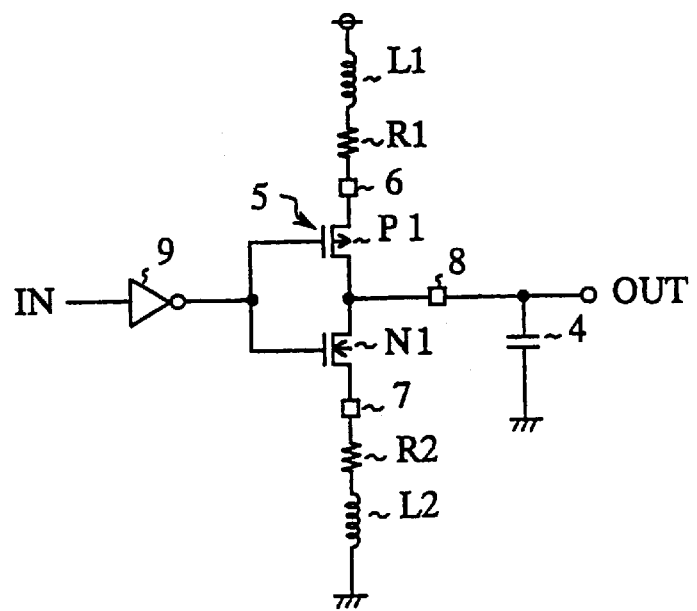
FIG. 2 is a circuit diagram showing an output circuit according to the related art.
Figure 3:
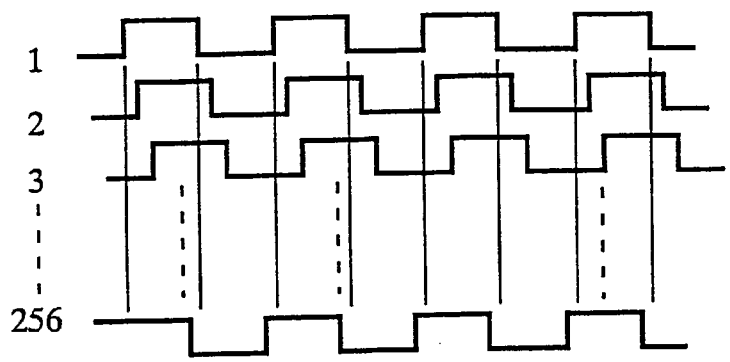
FIG. 3 is a waveform chart showing waveforms output by the waveform generating circuit of the pulse width modulating circuit.
Figure 4:
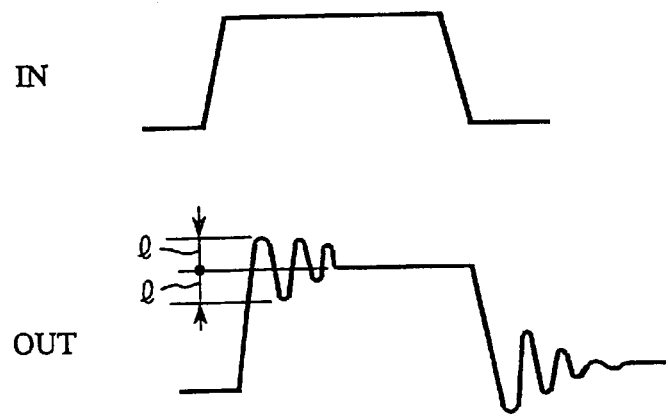
FIG. 4 is a waveform chart showing a signal output by the output circuit according to the related art.

The waveform generating circuit 31 supplied with the clock signal outputs a variety of differently-phased waveform signals, as shown in FIG. 3. The waveform selecting circuit 32 selects one of the waveform signals from among the input waveform signals based on, for example, an 8-bit data signal and a 2-bit control signal, and supplies the selected waveform signal to the output circuit 33.

As described in detail in the first embodiment, the output circuit 33 is configured such that the first built-in charge storing means charges the load capacitor 34 connected to the output terminal when the first polarity of the input signal occurs (for example, at the rising edge of the input signal). The load capacitor 34 is discharged via the second built-in charge storing means when the second polarity, different from the first polarity, of the input signal occurs (for example, at the falling edge of the input signal).

The pulse width modulating circuit according to the tenth embodiment is capable of high-precision pulse width modulation by using the output circuit 33 in which the level of ringing is reduced.

Eleventh Embodiment

FIG. 22 shows the construction of the semiconductor integrated circuit according to an eleventh embodiment of the present invention. Referring to FIG. 22, a semiconductor chip 40 is mounted on a molded substrate 41. External connection terminals 42a–42n, 43a–43n are provided at the molded substrate 41. The external connection terminals 42a–42n are connected to a power supply terminal Vcc of a printed circuit board (not shown), and the external connection terminals 43a–43n are connected to the grounding line of the printed circuit board.

The semiconductor chip 40 is provided with the output circuit 33 according to one of the first through ninth embodiments described above. A plurality of power supply pads 46a–46n are coupled to a power supply line 44 connected to the output circuit 33 and a plurality of grounding pads 47a–47n are coupled to a grounding line 45 connected to the output circuit 33. The pads 46a–46n are connected to the external connection terminals 42a–42n, respectively, via semiconductor lead frames 48a–48n, respectively. The pads 47a–47n are connected to the external connection terminals 43a–43n, respectively, via the semiconductor lead frames 49a–49n, respectively.

A description will now be given of the operation of the semiconductor integrated circuit according to the eleventh embodiment.

The output circuit 33 is supplied with power via the plurality of semiconductor lead frames 48a–48n and grounded via the plurality of semiconductor lead frames 49a–49n. The resultant combined inductance is smaller than the inductance of a single semiconductor lead frame. The description of the operation of the output circuit 33 has already been given in the embodiments above and will not be repeated here.

Thus, the eleventh embodiment reduces the combined inductance between the external power supply and the grounding pad of the output circuit by providing a plurality of semiconductor lead frames connected to the power supply pads and the grounding pads of the output circuit. Accordingly, the level of ringing is reduced.

A summarized description of the merits provided by the invention will now be given. The load capacitor is not charged by the external power supply but via the first charge storing means built in the semiconductor chip and precharged before the charging of the load capacitor. Likewise, the load capacitor is not discharged via the ground external to the chip but via the second charge storing means built in the semiconductor chip and discharging before the discharging of the load capacitor. Therefore, ringing is substantially prevented.

In further accordance with the invention, the charging and discharging circuit is configured to completely raise the voltage level at the output terminal to the power supply voltage Vcc and drop the same to the ground level. Accordingly, it is ensured that the device connected to the output terminal is caused to operate or stop operating in a proper manner.

In further accordance with the invention, it is ensured that the through current is prevented from flowing in the PMOS transistor and the NMOS transistor constituting the charging and discharging circuit. Accordingly, occurrence of ringing due to the through current is prevented.

In further accordance with the invention, the charge storing means is a PMOS transistor or an NMOS transistor permitting large-scale integration inside a semiconductor chip.

In further accordance with the invention, the charging and discharging process is not started by the charging and discharging circuit. Thus, it is ensured that the output terminal OUT is prevented from being charged or discharged via the inductive power supply line or the grounding line. Accordingly, ringing is prevented.

In further accordance with the invention, the charge storing means is connected in parallel with the charging and discharging circuit that is connected between the power supply terminal and the ground terminal. Accordingly, noise that occurs when the PMOS transistor or the NMOS transistor constituting the charging and discharging circuit switches from "H" to "L" or from "L" to "H" is reduced.

In further accordance with the invention, there are provided the output charging control circuit and the output discharging control circuit for charging and discharging the load capacitor by the charge storing means inside the semiconductor chip instead of the external power supply, the charging and discharging circuit for facilitating the charging and discharging of the load capacitor, the through current reducing circuit for the charging and discharging circuit, the delay circuit for delaying the charging and discharging by the charging and discharging circuit with respect to charging and discharging by the charge storing means, and the charge storing means connected to the power supply end and the ground end of the charging and discharging circuit. Further, connection between the output circuit and the power supply source is embodied by a plurality of lines, and connection between the output circuit and the ground are embodied by a plurality of lines. Thus, even when a large current switched at a high speed is caused to flow, occurrence of ringing due to the inductance is properly prevented.

In further accordance with the invention, the output circuit in which the level of ringing is reduced is used to construct a pulse width modulating circuit capable of high-precision pulse width modulation.

In further accordance with the invention, by providing a plurality of semiconductor lead frames to connect the output circuit to the power supply pads and the grounding pads, the combined inductance between the external power supply and the grounding pads is reduced so that a semiconductor integrated circuit in which the level of ringing is reduced is obtained.

The present invention is not limited to the above-described embodiments, and variations and modifications may be made without departing from the scope of the present invention.

What is claimed is:

1. An output circuit comprising:
   first charging means for storing electric charge for charging a load capacitor at an output terminal of the output circuit;
   second charging means for storing electric charge released by the load capacitor being discharged;
   a first output transistor for connecting a power supply terminal to the load capacitor;
   a second output transistor for connecting a ground to the load capacitor;
   an output charging control circuit, receiving an input signal, for controlling conduction of said first output transistor based on a first polarity of the input signal, charging the load capacitor via said first charging means when said first output transistor conducts, and charging said first charging means when said first output transistor does not conduct; and
   an output discharging control circuit, receiving the input signal, for controlling conduction of said second output transistor based on a second polarity, different from the first polarity, of the input signal, discharging said load capacitor via said second charge storing means when said second output transistor conducts, and discharging said second charge storing means when said second output transistor does not conduct.

2. The output circuit as claimed in claim 1, further comprising a charging and discharging circuit supplying additional charge for charging said load capacitor, in addition to charge provided by said first charge storing means, and discharging said load capacitor in cooperation with said second charge storing means.

3. The output circuit as claimed in claim 2, further comprising a through current reducing circuit providing a time difference between switching occurring in a charging path of the charging and discharging circuit and switching occurring in a discharging path of the charging and discharging circuit.

4. The output circuit as claimed in claim 2, further comprising a delay circuit for providing a delay in operation of the charging and discharging circuit in response to an inversion of polarity in the input signal, with respect to corresponding operation of said output charging control circuit and said output discharging control circuit.

5. The output circuit as claimed in claim 2, further comprising third charge storing means connected between the power supply terminal and the ground and in parallel with the charging and discharging circuit.

6. The output circuit as claimed in claim 1, wherein said first charge storing means and said second charge storing means includes a gate capacitance of an NMOS transistor.

7. The output circuit as claimed in claim 1, wherein said first charge storing means and said second charge storing means includes a gate capacitance of a PMOS transistor.

8. An output circuit comprising:
   first charging means for storing electric charge for charging a load capacitor at an output terminal of the output circuit;
   second charging means for storing electric charge released by the load capacitor being discharged;
   a first output transistor for connecting a power supply terminal to the load capacitor;
   a second output transistor for connecting a ground to the load capacitor;
   an output charging control circuit for controlling conduction of said first output transistor based on a first polarity of an input signal, charging the load capacitor via said first charging means when said first output transistor conducts, and charging said first charging means when said first output transistor does not conduct; and
   an output discharging control circuit for controlling conduction of said second output transistor based on a second polarity, different from the first polarity, discharging said load capacitor via said second charge storing means when said second output transistor conducts, discharging said second charge storing means when said second output transistor does not conduct;

a charging and discharging circuit supplying additional charge for charging said load capacitor, in addition to charge provided by said first charge storing means, and discharging said load capacitor in cooperation with said second charge storing means; and third charge storing means connected between the power supply terminal and the ground and in parallel with the charging and discharging circuit.

9. The output circuit as claimed in claim 8 comprising a through current reducing circuit providing a time difference between switching occurring in a charging path of the charging and discharging circuits and switching occurring in a discharging path of the charging and discharging circuits.

10. The output circuit as claimed in claim 9 comprising a delay circuit for providing a delay in operation of the charging and discharging circuits in response to an inversion of polarity in the input signal, with respect to corresponding operation of said output charging control circuit and said output discharging control circuit.

11. A pulse width modulating circuit comprising:

a waveform generating circuit for outputting differently-phased waveform signals based on an input clock signal;

a waveform selecting circuit for selecting one of the waveform signals output by said waveform generating circuit, based on a data signal and a control signal; and an output circuit provided with, as an input signal, the waveform signal selected by said waveform selecting circuit and comprising first charging means for storing electric charge for charging a load capacitor at an output terminal of the output circuit;

second charging means for storing electric charge released by the load capacitor being discharged;

a first output transistor for connecting a power supply terminal to the load capacitor;

a second output transistor for connecting a ground to the load capacitor;

an output charging control circuit, receiving the input signal, for controlling conduction of said first output transistor based on a first polarity of the input signal, charging the load capacitor via said first charging means when said first output transistor conducts, and charging said first charging means when said first output transistor does not conduct; and an output discharging control circuit, receiving the input signal, for controlling conduction of said second output transistor based on a second polarity, different from the first polarity, of the input signal, discharging said load capacitor via said second charge storing means when said second output transistor conducts, discharging said second charge storing means when said second output transistor does not conduct.

12. An output circuit comprising:

first charging means for storing electric charge for charging a load capacitor at an output terminal of the output circuit, said first charging means including a first switching transistor and a first pre-charging capacitance connected between a drain of the first switching transistor and ground;

second charging means for storing electric charge released by the load capacitor being discharged, said second charging means including a second switching transistor and a second pre-charging capacitance connected between a drain of the second switching transistor and ground;

a first output transistor for connecting a power supply terminal to the load capacitor;

a second output transistor for connecting a ground to the load capacitor;

an output charging control circuit for controlling conduction of said first output transistor based on a first polarity of an input signal, charging the load capacitor via said first charging means when said first output transistor conducts, and charging said first charging means when said first output transistor does not conduct, said output charging control circuit comprising a first logic gate having first and second input terminals, respectively receiving the input signal and the input signal after inversion and a first delay, and producing an output signal supplied to a gate terminal of said first switching transistor, and a first inverter receiving the output signal of the first logic gate and producing a first inverted output signal supplied to a gate terminal of said first output transistor, said first switching transistor and said first output transistor being connected in series between the power supply terminal and the load capacitor; and an output discharging control circuit for controlling conduction of said second output transistor based on a second polarity, different from the first polarity, discharging said load capacitor via said second charge storing means when said second output transistor conducts, and discharging said second charge storing means when said second output transistor does not conduct, said output discharge and control circuit comprising a second logic gate having first and second input terminals respectively receiving the input signal and the input signal after inversion and the first delay, and producing an output signal supplied to a gate terminal of said second switching transistor, and a second inverter receiving the output signal of the second logic gate and producing a second inverted output signal supplied to a gate terminal of said second output transistor, said second switching transistor and said second output transistor being connected in series between the ground and the load capacitor.

13. The output circuit as claimed in claim 12, wherein one of said first and second switching transistors is an NMOS transistor and one of said first and second pre-charging capacitances includes a gate capacitance of said NMOS transistor.

14. The output circuit as claimed in claim 12, wherein one of said first and second switching transistors is an PMOS transistor and one of said first and second pre-charging capacitances includes a gate capacitance of said PMOS transistor.

15. The output circuit as claimed in claim 12 wherein said first logic gate is an AND gate and said second logic gate is an OR gate.

* * * * *